United States Patent [19]

Lambrechtse et al.

[11] 4,039,860
[45] Aug. 2, 1977

[54] AMPLIFIER ARRANGEMENT FOR DETECTING LOGIC SIGNALS FROM A CAPACITANCE SOURCE

[75] Inventors: Cornelis Willem Lambrechtse; Roelof Herman Willem Salters, both of Eindhoven, Netherlands

[73] Assignee: U.S. Philips Corporation, New York, N.Y.

[21] Appl. No.: 643,255

[22] Filed: Dec. 22, 1975

[30] Foreign Application Priority Data

Feb. 28, 1975 Netherlands .................... 7502375

[51] Int. Cl.$^2$ .................. H03K 5/153; H03K 5/18; H03K 3/353; G11C 11/24
[52] U.S. Cl. ..................... 307/362; 307/279; 307/DIG. 3; 340/173 CA
[58] Field of Search ........ 307/DIG. 3, 221 C, 221 D, 307/235 R, 235 J, 235 K, 235 T, 235 W, 238, 279; 340/173 CA, 173 DR

[56] References Cited

U.S. PATENT DOCUMENTS

| 3,573,507 | 4/1971 | Eng .......................... 307/279 |
| 3,868,656 | 2/1975 | Stein et al. ............ 307/DIG. 3 X |

OTHER PUBLICATIONS

Chin et al., "Sense Latch for One-Device Memory Cell", *IBM Tech. Discl. Bull.,* vol. 15, No. 11, pp. 3379-3380, 4/1973.
Surgent, "Insulated Gate Field-Effect Transistor Amplifier Latch", vol. 13, No. 9, pp. 2670-2671, 2/1971, *IBM Tech. Discl. Bull.*

*Primary Examiner*—John S. Heyman
*Assistant Examiner*—Larry N. Anagnos
*Attorney, Agent, or Firm*—Frank R. Trifari

[57] ABSTRACT

Write-in and/or read out amplifier for a capacitive source of logic signals, wherein the input of an inverting amplifier stage including insulated-gate field effect transistors is, in a first phase, connected to the output by a first switching unit and subsequently connected by a selection unit to the capacitive source, whereupon the charge on the input is restored by a third switching unit.

6 Claims, 4 Drawing Figures

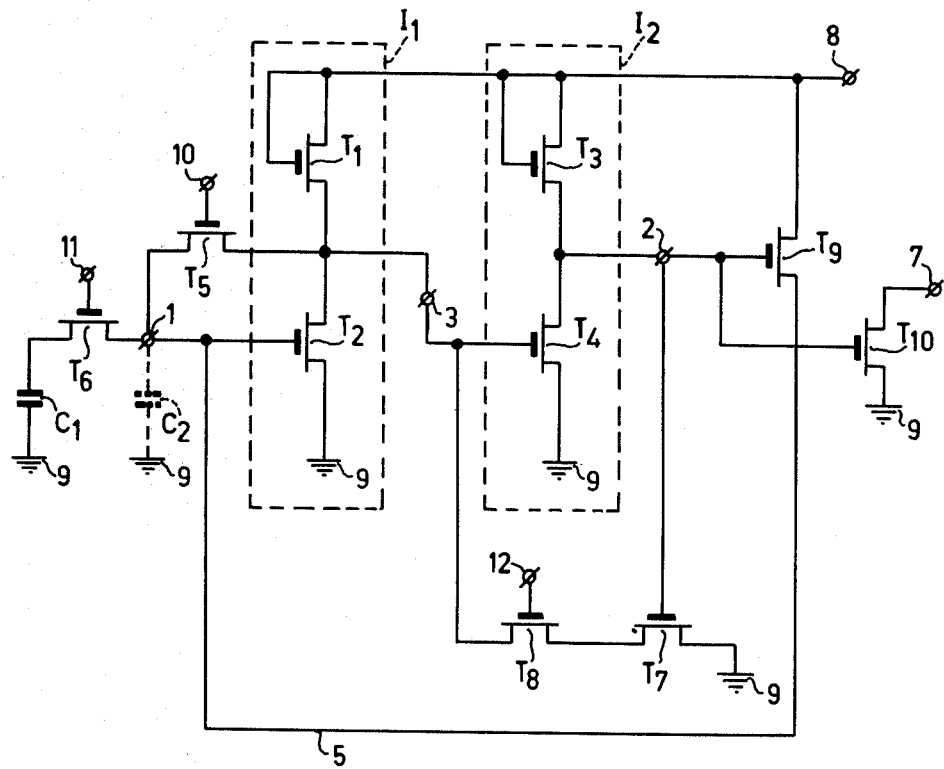
Fig.1
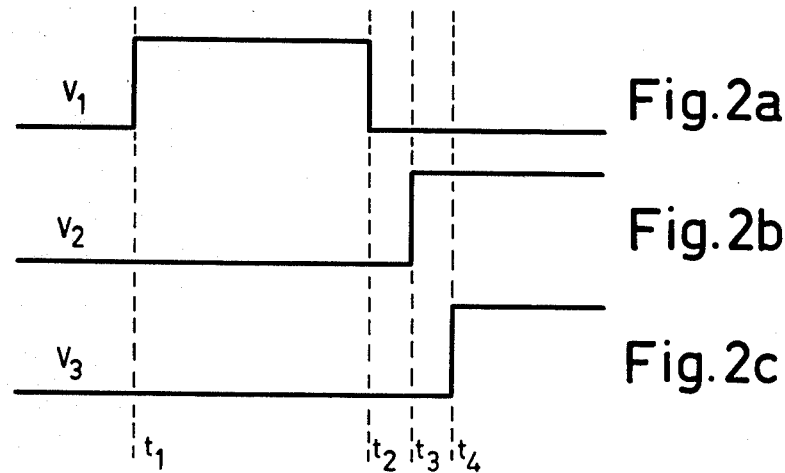
Fig.2a
Fig.2b
Fig.2c

AMPLIFIER ARRANGEMENT FOR DETECTING LOGIC SIGNALS FROM A CAPACITANCE SOURCE

The invention relates to an amplifier arrangement for amplifying small signals obtained from a capacitive source, for example a memory cell of a matrix-type dynamic MOS memory, which amplifier arrangement includes first and second inverting amplifiers in cascade between an input and an output which amplifiers are equipped with insulated-gate field-effect transistors, the amplifier arrangement further comprising a first switching unit which connects the output of the first inverting amplifier to its input, and a signal restoration circuit, detection of the signals being effected in accordance with a cycle of consecutive phases, i.e. a first phase during which negative feedback is applied to the amplifier arrangement via the first switching unit, which feedback is discontinued at the end of the first phase, and a second phase during which the signal to be detected is applied to the input of the first inverting amplifier.

Such an amplifier arrangement is known from the journal "I.E.E.E. International Solid State Circuit Conference", February, 1973, pages 26-28, and is used for reading or writing into a memory consisting of a matrix of memory cells. Each memory cell, as stated in said article, may for example consist of an insulated-gate field-effect transistor, with the aid of which selection of the memory cell is effected, and a capacitance in which information is stored. The two possible digital values which can be stored in such a memory cell are stored as different charges in said capacitance.

If the state of a memory cell is to be read, a read amplifier is required which is capable of detecting, via a read conductor, the difference in the charges stored in the two states. It appears that an amplifier equipped with insulated-gate field-effect transistors cannot readily be used for this purpose, because those have a threshold voltage which is substantially greater than the voltage swing which ultimately appears on the read conductor, which swing is only a fraction of the voltage swing occurring at the storage cell (owing to the comparatively high capacitance of the read conductor), whilst furthermore there is an appreciable spread in the magnitude of the threshold voltage.

An amplifier arrangement of the type mentioned in the preamble solves this problem by ensuring that the read conductor is charged or discharged to a reference voltage before the memory cell is selected.

In the amplifier arrangement described in said journal the read process is effected in accordance with a three-phase cycle. During the first phase of the cycle, during which phase an input signal is not yet available, the first switching unit is conducting. As in this known amplifier arrangement the two inverting amplifiers are assumed to be identical, the inputs and the outputs of the two inverting amplifiers will be at the same voltage, the reference voltage, at the end of this phase, which voltage also appears on the read conductor and lies in the linear part of the characteristic of the inverting amplifiers. At the end of the first phase the first switching unit becomes non-conducting. Owing to the use of insulated-gate field-effect transistors, the amplifiers have a capacitive input, so that the voltages appearing in the circuit are maintained. During the second phase of the cycle the input signal is applied to the input of the first inverting amplifier, so that a charge exchange takes place between the input capacitance which also includes the read conductor capacitance which has been brought to the reference voltage, and the storage capacitance. As a result, depending on the state of the memory cell, the input voltage will slightly increase or decrease. This change of the input voltage appears in amplified form at the output of the second inverting amplifier. When this occurs the voltage variation at the output is too small to be used as a logic signal and to restore the charge on the storage capacitance. Therefore, in a third phase, the output of the second inverting amplifier is connected to the input of the first inverting amplifier by means of a switching unit. This results in positive feedback which renders the amplifier arrangement unstable. Depending on the direction of the output voltage variation the amplifier will be driven in one or the other sense, so that a logic signal of sufficient amplitude is obtained at the output. As the signal processing in the amplifier takes some time owing to the capacitive operation, the third phase cannot be started simultaneously with the second phase. At the beginning of the second phase the amplified input signal is only just present at the output or else is not present at all, so that owing to disturbances and other effects the positive feedback might then bring the amplifier into a wrong logic state. This means that the logic signal can only become available at the output after three consecutive phase signals have been applied, which causes an undesired time delay.

Another problem associated with the read-out of capacitive memory cells, is said charge exchange occurring during the read out of the memory cell. As a result, after repeated read out of an "empty" memory cell, the cell will become charged to the reference voltage and after repeated read out of a "full" cell said cell will become discharged to the reference voltage, in addition to which there is the discharge which occurs owing to leakage. When the input voltage substantially equals the reference voltage, there will be substantially no voltage variation at the output of the amplifier arrangement during the second phase. The positive feedback bringing the amplifier circuit into an unstable state during the third phase will give rise to a logic output signal whose polarity cannot be predicted. In order to avoid such errors occurring the charge of the memory cell must be restored after each read period. In the known amplifier arrangement this is effected through the positive feedback in the third phase, because during the third phase the same voltage appears at the input of the amplifier arrangement as at the output. If the memory cell is still connected to the input of the amplifier arrangement during the third phase, the charge content of the cell will be restored.

The problem of charge restoration has been solved in the known amplifier arrangement, but this arrangement has the drawback that the logic signal is not available until after three phase signals have been applied. It is an object of the invention to provide an amplifier arrangement with a charge restoration circuit, in which the logic signal becomes available after only two phase signals. For this, the invention is characterized in that the signal restoration circuit includes a circuit between the input of the first inverting amplifier and a first point of constant voltage, which circuit includes a second switching unit, which second switching unit is controlled by the output voltage of the second inverting amplifier and has a threshold voltage, whilst the second switching unit is non-conducting for an output voltage of the second inverting amplifier on one side of said threshold voltage and conducting for an output voltage on the other side of said threshold voltage, the output voltage of the second inverting amplifier being on the one side of said threshold voltage during the first phase.

The invention is based on recognition of the fact, that by arranging tht the output voltage of the second inverting amplifier during the first phase lies on that side of the threshold voltage of the second switching unit for which said switching unit is non-conducting, it has become possible to define the logic condition of the output signal with respect to a voltage which is not that output voltage of the amplifier arrangement which corresponds to an input voltage equal to the reference voltage. As a result, the logic condition of the output signal of the amplifier arrangement is not indeterminate for input signals having a value which substantially equals the reference voltage, which makes the third phase redundant, because the logic condition of the output is no longer uncertain before the amplified input signal has appeared at the output. Output signals for which the second switching unit is non-conducting may be defined as a first logic condition and output signals for which the second switching unit is conducting may be defined as a second logic condition.

The fact that the amplifier circuit receives no positive feedback via the signal restoration circuit for output signals corresponding to the first logic condition, so that the output signal is not then additionally amplified, is by no means a drawback as far as further signal processing is concerned, because the input stage of a further circuit may be constituted by a switching unit similar to the second switching unit, said similar switching unit remaining non-conducting for a signal corresponding to the first logic condition.

Similarly, it is not a drawback that no charge restoration takes place for signals corresponding to the first logic condition. Indeed, input signal voltages equal to the reference voltage always give rise to the first logic condition at the output, so that there is no objection against input signals which give rise to output signals corresponding to the first logic condition being made equal to the reference voltage by charging or discharging the storage capacitance.

For output signals corresponding to the second logic condition signal restoration is effected by charging or discharging the input capacitance via the signal restoration circuit. This also results in positive feedback occurring in the amplifier circuit for output signals corresponding to the second logic condition, because owing to the signal restoration the output signal corresponding to the second logic condition is also additionally amplified, which is advantageous because the switching unit at the input of said further circuit for the processing of output signals can become conductive more readily as a result.

In an amplifier arrangement according to the invention it is advantageous if the amplifier arrangement further includes a third switching unit in a circuit between the input of the second inverting amplifier and a second point of constant voltage, which third switching unit is also controlled by the output voltage of the second inventing amplifier and has a threshold voltage, the third switching unit being non conducting for an output voltage of the second inverting amplifier on one side of said threshold voltage and conducting for an output voltage of the second inverting amplifier on the other side of said threshold voltage, the output voltage of the second invention amplifier lying on the one side of said threshold voltage during the first phase.

The advantage of this is that the second inverting amplifier is then driven by itself for output signals corresponding to the second logic condition so that the corresponding output signal is additionally amplified. This drive is faster than the positive feedback via the signal restoration circuit, because an appreciable capacitance must be charged for this positive feedback.

In this respect it should be noted that the threshold voltage of the third switching unit need not be equal to the threshold voltage of the second switching unit. The requirement is that the switching units are non-conducting for output signals which correspond to input signals which equal the reference voltage. The first logic condition is then always defined. For output signals corresponding to the second logic condition the two switching units will become conductive because the output signal will become sufficiently high owing to the amplifier being driven. In this respect it is advantageous if the threshold voltage of the third switching unit lies between the threshold voltage of the second-switching unit and the output voltage of the amplifier arrangement which corresponds to input signals equal to the reference voltage. This third switching unit will then become conducting sooner than the second switching unit, which is advantageous because driving the second inverting amplifier is effected faster than driving the amplifier arrangement via the charge restoration circuit which is energized by means of the second switching unit.

In an amplifier arrangement according to the invention, including the above-mentioned third switching unit it is advantageous if the amplifier arrangement includes means for interrupting the circuit between the input of the second inverting amplifier and the second point of constant voltage during the first phase.

During the first phase the first switching unit interconnects the input and output of the first inverting amplifier. On the other hand, if the second logic condition has been read during the previous cycle, the third switching unit will connect the input of the second inverting amplifier and thus the output of the first inverting amplifier to the second point of constant voltage. It is thus being attempted to hold the input of the second inverting amplifier at the voltage of the second point via the third switching unit and it is also being attempted to bring the input of the second inverting amplifier to the reference voltage via the first switching unit, which is necessary to restore the first logic condition at the output. In order to achieve the desired result, the design of the amplifier arrangement would have to comply with a number of requirements. This is avoided by the use of said means.

A preferred embodiment of an amplifier arrangement according to the invention is characterized in that the third switching unit is an insulated-gate field-effect transistor, whose main current path is included between the input of the second inverting amplifier and said second point of constant voltage and whose gate electrode is connected to the output of the second inverting amplifier, whilst said field-effect transistor has a threshold voltage which is the same as the threshold voltage of the field-effect transistors used in the first and the second inverting amplifier, the absolute values $A_1$ and $A_2$ of the gain factors of the first and second inverting amplifiers respectively around their operating points during the first phase being such that $A_2 > A_1 + 1$.

When this requirement is met it is found that the output voltage of the second inverting amplifier lies below the threshold voltage of the field-effect transistor during the first phase. Moreover, it follows that the gain factors merely should meet this requirement.

Furthermore, it may be advantageous if said means comprise a fourth switching unit, which forth switching unit is included in series with the third switching unit between the input of the second inverting amplifier and the second point of constant voltage.

In this case the fourth switching unit can be controlled with the same switching signal as the transistor with which the desired memory cell is selected.

Another possibility is characterized in that said fourth switching unit is included between the output of the second inverting amplifier and said second point of constant voltage.

Said fourth switching unit may then be controlled by the same signal as the first switching unit.

The invention will be described in more detail with reference to the drawing.

FIG. 1 shows a preferred embodiment of an amplifier arrangment according to the invention, and FIG. 2 shows some switching signals associated with the amplifier arrangement of FIG. 1.

The amplifier arrangement of FIG. 1 comprises two inverting amplifiers $I_1$ and $I_2$ connected in cascade. Each inverting amplifier $I_1$ and $I_2$ consists of two insulated-gate field-effect transistors $T_1$, $T_2$ and $T_3$, $T_4$ respectively, whose main current paths are connected in series between supply terminals 8 and 9. The transistors $T_2$ and $T_4$ function as input transistors for the respective inverting amplifier in that their gate electrodes are connected to input connection points 1 and 3 respectively, whilst the transistors $T_1$ and $T_3$ act as loads for the transistors $T_2$ and $T_4$ in that they are connected as resistors because they have a fixed voltage applied to their gate electrodes.

The output of the first inverting amplifier $I_1$ is constituted by the common point of the transistors $T_1$ and $T_2$ and is connected to an output connection point which is directly connected to the input connection point 3 of the second inverting amplifier $I_2$. The output of the second inverting amplifier $I_2$ is similarly formed by the common point of the transistors $T_3$ and $T_4$ and is connected to an output connection point 2.

The first switching unit is formed by an insulated-gate field-effect transistor $T_5$. The main current path of transistor $T_5$ connects the output connection point 3 of the first inverting amplifier $I_1$ to its input connection point 1. The gate electrode of transistor $T_5$ is connected to a connection point 10, to which a voltage $V_1$ can be applied for controlling the switching unit $T_5$.

The input connection point 1 of the first inverting amplifier is connected to, for example, a column of memory cells, one of which is shown in FIG. 1. This memory cell is formed by a capacitance $C_1$, one side of which is connected to a point of fixed potential and the other side of which is connected, via the main current path of a selection transistor $T_6$ of the insulated-gate type, to the input connection point 1 via a read conductor, whose capacitance together with the input capacitance of the amplifier arrangement is represented by the dotted capacitance $C_2$ in FIG. 1. The gate electrode of the selection transistor is connected to a connection point 11 to which a selection control voltage $V_2$ can be applied.

The third switching unit is constituted by an insulated-gate type transistor $T_7$, whose main current path connects the input connection point 3 of the second inverting amplifier $I_2$ to point 9 of constant potential. In the embodiment shown this point 9 is at earth potential. The gate electrode of transistor $T_7$ is connected to output connection point 2 of the second inverting amplifier $I_2$.

The signal restoration circuit 5 includes the second switching unit which is formed by an insulated-gate transistor $T_9$, whose main current path connects the supply point 8 to the input connection point 1 of the first inverting amplifier $I_1$ and whose gate electrode is connected to the output connection point 2 of the second inverting amplifier $I_2$.

The fourth switching unit is formed by an insulated-gate transistor $T_8$ whose main current path is included in series with the main current path of transistor $T_7$ between the input connection point 3 of the second inverting amplifier and point 9 of constant potential. The gate electrode of transistor $T_8$ is connected to a connection point 12 to which a control voltage $V_3$ can be applied.

FIG. 1 furthermore shows a transistor $T_{10}$ of the insulated-gate type, whose gate electrode is connected to the output connection point 2 and whose main current path connects a point 7 to the pont 9. Said transistor is the input transistor of a circuit, not shown, for processing the logic signal further.

All transistors in the amplifier arrangement of FIG. 1 are assumed to be of the same type, for example N-channel MOS-transistors.

The operation of the amplifier arrangement of FIG. 1 will be explained in more detail with reference to FIG. 2, in which FIG. 2a respresents the voltage $V_1$ which is applied to the connection point 10, FIG. 2b the voltage $V_2$ which is applied to the connection point 11, and FIG. 2c the voltage $V_3$ which is applied to the connection point 12.

If such a control voltage $V_1$ is applied to the gate electrode of transistor $T_5$ during the first phase $(t_1-t_2)$ that this transistor is turned on, the inverting amplifier $I_1$ will be biassed to a point at which the voltage at the input connection point 1 equals the voltage at the input connection point 3. This voltage is the reference voltage $V_R$ mentioned previously. The capacitance $C_2$ then becomes charged or discharged to said voltage $V_R$, which voltage $V_R$ is determined by the supply voltage and by the channel dimensions of the transistors $T_1$ and $T_2$.

As has been stated in the introduction, in this condition the output voltage of the second inverting amplifier $I_2$ is arranged to be smaller than the threshold voltage $V_T$ of transistor $T_7$. It is found that if the transistors $T_1$, $T_2$, $T_3$, $T_4$ and $T_7$ have the same threshold voltage, this requirement is met when $A_2 > A_1 + 1$, where $A_1$ and $A_2$ are the absolute values of the gain factors of the inverting amplifiers $I_1$ and $I_2$ respectively around their operating points during the first phase $(t_1 - t_2)$. The result of this is that transistor $T_7$ and also transistors $T_9$ and $T_{10}$, which are assumed to have the same threshold voltage as transistor $T_7$ are non-conducting during the first phase output voltages for which transistor $T_7$ and consequently transistors $T_9$ and $T_{10}$ are turned off are defined as the first logic condition, whilst those output voltages for which transistor $T_7$ and transistor $T_{10}$ are conducting are defined as the second logic condition. The further circuit, of which transistor $T_{10}$ is the input transistor, can ascertain the logic condition of the output signal of the amplifier arrangement from the conducting or non-conducting state of transistor $T_{10}$.

At the end of the first phase ($t_2$ in FIG. 2) transistor $T_5$ is made non-conducting. The amplifier arrangement remains in the same state owing to the absence of a connection via which capacitance $C_2$ can discharge.

At the instant $t_3$, at the beginning of the second phase transistor $T_6$ is turned on by a suitable control voltage $V_2$ (FIG. 2b) at the connection point 11. This results in a charge exchange between the capacitances $C_1$ and $C_2$, three situations being possible namely, the situations in which the voltage at the storage capacitance $C_1$ is lower than, equal to and higher than the reference voltage $V_R$, respectively.

If the voltage at the storage capacitance $C_1$ is smaller than the reference voltage, the voltage at the input connection point 1 will slightly decrease owing to the charge exchange between the capacitances $C_1$ and $C_2$. This decrease will appear at the output connection point 2 amplified by a factor $A_1A_2$, so that the transistors $T_7$ and $T_{10}$ remain cut off. The non-conducting state of transistor $T_7$ is then that which has been defined as the first logic condition. Transistor $T_9$ also remains cut off. Charge restoration does not take place.

When the voltage at the memory cell equals the reference voltage, no charge exchange is effected and transistors $T_7$, $T_9$ and $T_{10}$ also remain cut off and the first logic condition is detected. It follows that the contents of the storage capacitance $C_1$ in the first logic condition need not be restored. Indeed, the logic condition is not uncertain even when the storage capacitance $C_1$ has been charged to the reference voltage $V_R$ after repeated read-out.

If the voltage at the storage capacitance $C_1$ is higher than the reference voltage $V_R$, the voltage at the input connection point 1 increases owing to the charge exchange between the capacitance $C_1$ and $C_2$. When this increase is sufficient, this increase amplified by a gain factor $A_1$, $A_2$ will turn on transistor $T_7$ as well as transistors $T_9$ and $T_{10}$. In this case the output voltage is that which has been defined as the second logic condition. If it is assumed that transistor $T_8$ is conducting, a conducting connection is then established via the main current path of transistor $T_7$ between the input of the second inverting amplifier and point 9 of constant potential, so that the second inverting amplifier $I_2$ is driven into cut-off. The voltage at the output connection point 2 will consequently approximate to the voltage at the supply connection point 8 minus the voltage drop across transistor $T_3$. Transistor $T_9$ will then conduct sufficiently, so that the storage capacitance $C_1$ is rapidly charged via the main current path of transistor $T_9$ to the supply voltage which appears at the supply connection point 8, minus some voltage drop across transistor $T_9$. Thus, the second logic condition of capacitor $C_1$ is restored.

The main current path of transistor $T_8$ is included in series with the main current path of transistor $T_7$ in order to interrupt the conducting connection between the input connection point 3 and point 9 of constant potential during the first phase. When transistor $T_7$ is conductive, the second inverting amplifier initially remains in the cutoff state, so that the amplifier arrangement cannot readily be biassed to the operating point in the first phase of a following read cycle. In order to avoid this, transistor $T_8$ is controlled by a signal $V_3$ (FIG. 2c), in such a way that this transistor becomes conductive during the second phase at instant $t_4$. Instant $t_4$ is preferably selected to coincide with the instant $t_3$, because transistors $T_6$ and $T_8$ can then be controlled by the same signal, so that no third phase signal is required.

Instead of including transistor $T_8$ in series with transistor $T_7$, transistor $T_8$ may inter alia be included between the output connection point 2 of the second inverting amplifier and point 9 at earth potential. Transistor $T_8$ may then be controlled by the same signal as transistor $T_5$. At the beginning of the first phase the output of the second inverting amplifier will then go to earth potential, so that transistor $T_7$ assumes the non-conducting state.

In a memory a column of memory cells with selection transistors may be coupled to the input connection point 1. One amplifier arrangement according to the invention is then required for each column. As transistor $T_{10}$ is turned on after selection of a memory cell if the relevant memory cell stores a charge which corresponds to an output signal in the second logic condition, it is possible to interconnect the points 7 of all read amplifiers, provided that the drive of the second inverting amplifier is discontinued after each read cycle by means of a signal at the gate electrode of transistor $T_8$. Only the transistor $T_{10}$ which belongs to the column amplifier which is in the read-out phase, can then be conducting, whilst all other transistors $T_{10}$ are non-conducting.

The invention is by no means limited to the embodiment shown.

The amplifier arrangement according to the invention can moreover be arranged to act as a write- and/or read amplifier by connecting a write input to the points 1, 2 or 3.

What is claimed is:

1. An amplifier arrangement including insulated-gate field effect transistors for detecting logic signals from a capacitance source comprising: a supply source of a constant voltage, at least one inverting amplifier stage defining a reference voltage at its output, a first switching circuit to connect, when activated during a first phase, the output of said one amplifier stage to the input thereof, a selection control circuit operable to connect, when activated during a subsequent second phase, the input of said one amplifier stage to the capacitance source, and a charge restoration circuit including a second switching circuit controlled by the output of said amplifier stage and connected between one terminal of the supply source and the input of said one amplifier stage.

2. An amplifier arrangement as claimed in claim 1, further comprising a second inverting amplifier stage connected in cascade with said one amplifier stage, and a third switching circuit controlled by the output of said second amplifier stage and connected between the input of said second amplifier stage and the other terminal of said supply source.

3. An amplifier arrangement as claimed in claim 2, wherein the third switching circuit includes means for interrupting the circuit between the input of the second inverting amplifier and the other terminal during the first phase.

4. An amplifier arrangement as claimed in claim 3, wherein said interrupting means comprise a fourth switching unit, which fourth switching unit is included in series with the third switching unit between the input of the second inverting amplifier and the other terminal.

5. An amplifier arrangement as claimed in claim 3, characterized in that said interrupting means comprise a fourth switching unit which is included between the output of the second inverting amplifier and said other terminal.

6. An amplifier arrangement as claimed in claim 2, wherein the third switching unit is an insulated-gate field-effect transistor, whose main current path is included between the input of the second inverting amplifier and said other terminal and whose gate electrode is connected to the output of the second inverting amplifier, said field-effect transistor having a threshold voltage which is the same as the threshold voltage of the field-effect transistors used in the first and the second inverting amplifiers, the absolute values $A_1$ and $A_2$ of the gain factors of the first and second inverting amplifiers around their operating points during the first phase being such that $A_2 > A_1 + 1$.

* * * * *